United States Patent
Koshimizu et al.

(10) Patent No.: US 6,818,560 B1
(45) Date of Patent: Nov. 16, 2004

(54) PLASMA PROCESSING APPARATUS AND PLASMA PROCESSING METHOD

(75) Inventors: Chishio Koshimizu, Yamanashi (JP); Kazunori Nagahata, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 09/665,940

(22) Filed: Sep. 21, 2000

(30) Foreign Application Priority Data

Sep. 22, 1999 (JP) .......................................... 11-268578

(51) Int. Cl.[7] ...................... H01L 21/302; H01I 21/3065
(52) U.S. Cl. ....................... 438/706; 438/710; 438/716; 156/345
(58) Field of Search ................................. 438/706, 710, 438/716, 712, 702; 156/345

(56) References Cited

U.S. PATENT DOCUMENTS

| | | | | |
|---|---|---|---|---|
| 5,155,331 A | * | 10/1992 | Horiuchi et al. ............ | 219/121 |
| 5,271,788 A | * | 12/1993 | Hasegawa et al. .......... | 156/345 |
| 5,478,429 A | * | 12/1995 | Komino et al. ............. | 156/345 |
| 5,494,522 A | * | 2/1996 | Moriya et al. .............. | 118/719 |
| 5,529,657 A | * | 6/1996 | Ishii ........................... | 156/345 |
| 5,557,215 A | * | 9/1996 | Saeki et al. ................. | 324/765 |
| 5,578,129 A | * | 11/1996 | Moriya ....................... | 118/719 |
| 5,709,757 A | * | 1/1998 | Hatano et al. ............ | 134/22.14 |
| 5,769,952 A | * | 6/1998 | Komino ..................... | 118/733 |
| 5,779,807 A | * | 7/1998 | Dornfest et al. ............. | 134/1.2 |
| 5,795,399 A | * | 8/1998 | Hasegawa et al. ........... | 134/1.3 |
| 5,868,484 A | * | 2/1999 | Tsukamoto ............. | 118/723 E |
| 5,904,779 A | * | 5/1999 | Dhindsa et al. ......... | 118/723 E |

* cited by examiner

Primary Examiner—Nadine G. Norton
Assistant Examiner—Lynette T. Umez-Eronini
(74) Attorney, Agent, or Firm—Finnegan, Henderson, Farabow, Garrett & Dunner LLP

(57) ABSTRACT

A plasma processing apparatus and a plasma processing method which make it possible to prevent an abnormal discharge from occurring during workpiece removal without having to modify the design or resulting in a reduction in throughput are provided. A wafer W placed on a lower electrode 106 inside a processing chamber 102 at an etching apparatus 100 undergoes the etching process. When the etching process ends, the polarity of the high level DC voltage applied to an electrostatic chuck 108 vacuum holding the wafer W is reversed. A gate valve G is opened to allow $N_2$ inside a delivery chamber 200 in communication with the processing chamber 102 to flow in. The pressure inside the processing chamber 102 is thus raised to allow a gentle self discharge of the residual charge at the wafer W. Even when the wafer W is removed from the chuck surface of the electrostatic chuck 108 by a lifter pin 130 by lowering the lower electrode 106 from the plasma processing position to the delivery position, no abnormal discharge occurs between the wafer W and the conductive lifter pin 130.

14 Claims, 5 Drawing Sheets

PLASMA PROCESSING APPARATUS AND PLASMA PROCESSING METHOD

BACKGROUND OF THE INVENTION

The present invention relates to a plasma processing apparatus and a plasma processing method.

PRIOR ART

An etching apparatus is utilized in a process for manufacturing semiconductor devices in the prior art. The etching apparatus employed in the manufacturing process is often a plasma etching apparatus constituted by providing an upper electrode and a lower electrode facing opposite each other within a processing chamber. In such an etching apparatus, the processing gas introduced into the processing chamber is raised to plasma when high-frequency power is applied to the lower electrode. In the plasma etching apparatus structured as described above, a workpiece placed on the lower electrode, e.g., a semiconductor wafer (hereafter referred to as a "wafer"), undergoes a plasma etching process.

In addition, a wafer having undergone the process is taken out of the processing chamber in the following manner. First, while sustaining the atmosphere inside the processing chamber at a reduced pressure which is required for the process, the lower electrode is lowered from the plasma processing position near the upper electrode to the wafer delivery position located further downward. Also, the application of the high level DC voltage to the electrostatic chuck vacuum holding the wafer is stopped. Next, when the lower electrode is completely lowered to the delivery position, a lifter pin is raised to remove the wafer from the mounting surface and position it above the mounting surface. Then, a gate valve connecting the processing chamber and a delivery chamber is released to carry the wafer from the processing chamber into the delivery chamber.

The electrostatic chuck is constituted by enclosing a conductive thin film with an insulating thin film. Consequently, the wafer placed on the electrostatic chuck is insulated from the ground. If plasma processing is performed in this state, the electrical charge accumulated at the wafer is not released due to the presence of the electrostatic chuck even after the processing is completed, and thus, the electrical charge remains at the wafer as a residual charge. In addition, the wafer is transported after the lower electrode is lowered to the delivery position in the apparatus described above. As a result, the distance between the wafer on the lower electrode and the upper electrode increases as the lower electrode travels downward. The voltage between the wafer and the upper electrode attributable to the residual charge increases as the distance between the wafer and the upper electrode lengthens. For instance, if the distance between the wafer set at the delivery position and the upper electrode is four times as large as the distance between the wafer set at the plasma processing position and the upper electrode, the voltage between the wafer set at the delivery position and the upper electrode becomes as high as five times the voltage between the wafer set at the plasma processing position and the upper electrode, as calculated by using the following formula:

$$V = (Q \cdot d)/(S \cdot \epsilon).$$

It is to be noted that in the expression above, V represents the voltage between the wafer and the upper electrode, Q represents the residual charge at the wafer, d represents the distance between the wafer and the upper electrode, S represents the surface area of the wafer and $\epsilon$ represents the dielectric constant. Thus, when the gas inside the delivery chamber is allowed to flow into the processing chamber by releasing the gate valve, a local discharge occurs between the wafer and the conductive lifter pin, to cause damage to the wafer. This problem also occurs when the internal wall of the processing chamber facing opposite the mounting surface of the lower electrode is constituted of a dielectric material, as in a microwave type plasma etching apparatus or an inductively-coupled plasma etching apparatus.

There is a technology in the prior art that has been proposed to prevent the abnormal discharge described above by introducing an inert gas into the processing chamber before lowering the lower electrode to the delivery position and thus causing the residual charge at the wafer to self discharge. However, there is a problem in that it is difficult to introduce a large volume of the inert gas in a short period of time by introducing the inert gas from a processing gas supply system, resulting in a reduction in throughput. Furthermore, another gas supply system must be provided in order to introduce the inert gas from a dedicated gas supply system. This necessitates a major modification of the apparatus structure leading to an increase in the initial cost.

SUMMARY OF THE INVENTION

An object of the present invention, which has been completed by addressing the problems of the prior art discussed above, is to provide a new and improved plasma processing apparatus and a new and improved plasma processing method that make it possible to eliminate the problems described above and other problems.

In order to achieve the object described above, in a first aspect of the present invention, a plasma processing apparatus for implementing a plasma processing on a workpiece, comprising plasma processing chamber, the atmosphere in which is sustained at a reduced pressure during the plasma processing, an electrode provided inside the plasma processing chamber that is constituted to allow the workpiece to be placed thereupon and is capable of traveling between an upper plasma processing position and a lower delivery position, an electrostatic chuck provided at a mounting surface of the electrode that detachably electrostatic holds the workpiece when a high level DC voltage is applied thereto, a delivery chamber engaged in transfer of the workpiece with the plasma processing chamber with the atmosphere therein sustained at a higher pressure compared to the atmosphere in the plasma processing chamber, a means for opening/closing which connects/disconnects the plasma processing chamber and the delivery chamber while retaining the airtightness therein and a means for control that engages in control to introduce a gas inside the delivery chamber into the plasma processing chamber by opening the means for opening/closing until the electrode departing the plasma processing position reaches the delivery position after the plasma processing is completed, is provided, as disclosed in claim 1.

According to the present invention, the high-pressure gas inside the delivery chamber can be introduced into the plasma processing chamber by opening the means for opening/closing before the electrode completes its descent to the delivery position following the end of plasma processing. Thus, in a plane-parallel type plasma processing apparatus, for instance, the residual charge at the workpiece can be eliminated by causing the residual charge to become gently released by itself before the voltage between the upper electrode facing opposite the lower electrode and the workpiece becomes high. In addition, in a microwave type plasma processing apparatus or an inductively-coupled plasma processing apparatus, the residual charge at the workpiece can be eliminated in a manner similar to that described above before the voltage between the top plate constituted as a dielectric wall facing opposite the electrode and the workpiece becomes high. As a result, no abnormal discharge occurs even when the workpiece is disengaged from the electrode having completed its descent to the delivery position, to prevent damage to the workpiece. Normally, a gas at a pressure higher than the pressure of the gas inside the plasma processing chamber is constantly introduced into the delivery chamber at a high flow rate in order to prevent particles inside the plasma processing chamber from circulating while the means for opening/closing is opened. Furthermore, the workpiece intake/outlet communicating between the space inside the plasma processing chamber and the space inside the delivery chamber is formed over a relatively large range to allow a means for delivery holding the workpiece to pass through. Thus, the gas can be instantaneously introduced into the plasma processing chamber without having to make a major design modification in the apparatus structure. Consequently, the speed at which the electrode travels while introducing the gas does not need to be lowered and a reduction in throughput is prevented. Moreover, the present invention can be implemented with ease while minimizing an increase in the initial cost.

In addition, as disclosed in claim 2, for instance, the means for control should engage in control for applying a high level DC voltage to the electrostatic chuck having the reverse polarity from the polarity of the high level DC voltage applied to the electrostatic chuck while the electrostatic chuck is vacuum holding the workpiece, until immediately after the means for opening/closing is opened. In this structure, by applying the high level DC voltage with the reverse polarity, the self discharge of the residual charge at the workpiece can be introduced with further ease. As a result, the residual charge is minimized. Thus, the workpiece can be disengaged from the electrostatic chuck with ease to prevent a generation of particles. Furthermore, occurrence of an abnormal discharge at the workpiece can be prevented with a high degree of reliability.

In a second aspect of the present invention, a plasma processing method for implementing plasma processing on a workpiece in a reduced pressure atmosphere by placing the workpiece at a mounting surface of an electrode provided inside a plasma processing chamber and applying a high level DC voltage to an electrostatic chuck provided at the mounting surface of the electrode to cause the electrostatic chuck to vacuum hold the workpiece, comprising a step in which the electrode is moved from an upper plasma processing position to a lower delivery position after the plasma processing ends and a step in which a means for opening/closing that switchably connects a delivery chamber engaged in transfer of the workpiece to/from plasma processing chamber, with the plasma processing chamber, is opened before the electrode reaches the delivery position and the gas inside the delivery chamber the atmosphere, which is sustained at a higher pressure than the atmosphere inside the plasma processing chamber, is introduced into the plasma processing chamber, as disclosed in claim 12, is provided.

According to the present invention, the pressure inside the plasma processing chamber is raised by introducing the high-pressure gas inside the delivery chamber into the plasma processing chamber before the electrode reaches the delivery position following the plasma processing end. As a result, the residual charge at the workpiece can be eliminated before the pressure between the workpiece and the upper electrode or between the workpiece and the dielectric wall becomes high, to prevent damage to the workpiece.

In addition, it is desirable for the plasma processing method to further comprise a step in which a high level DC voltage with a reverse polarity from the polarity of the high level DC voltage applied to the electrostatic chuck while the electrostatic chuck is vacuum holding the workpiece is applied to the electrostatic chuck until immediately after the means for opening/closing is opened, as in the invention disclosed in claim 13, for instance. Through this method, the self discharge of the residual charge at the workpiece is further promoted.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of embodiments in which the plasma processing apparatus and the plasma processing method according to the present invention are adopted in a plasma etching apparatus and a plasma etching method, given in reference to the attached drawings.

First Embodiment
(1) Structure of Etching Apparatus

Figure 1:
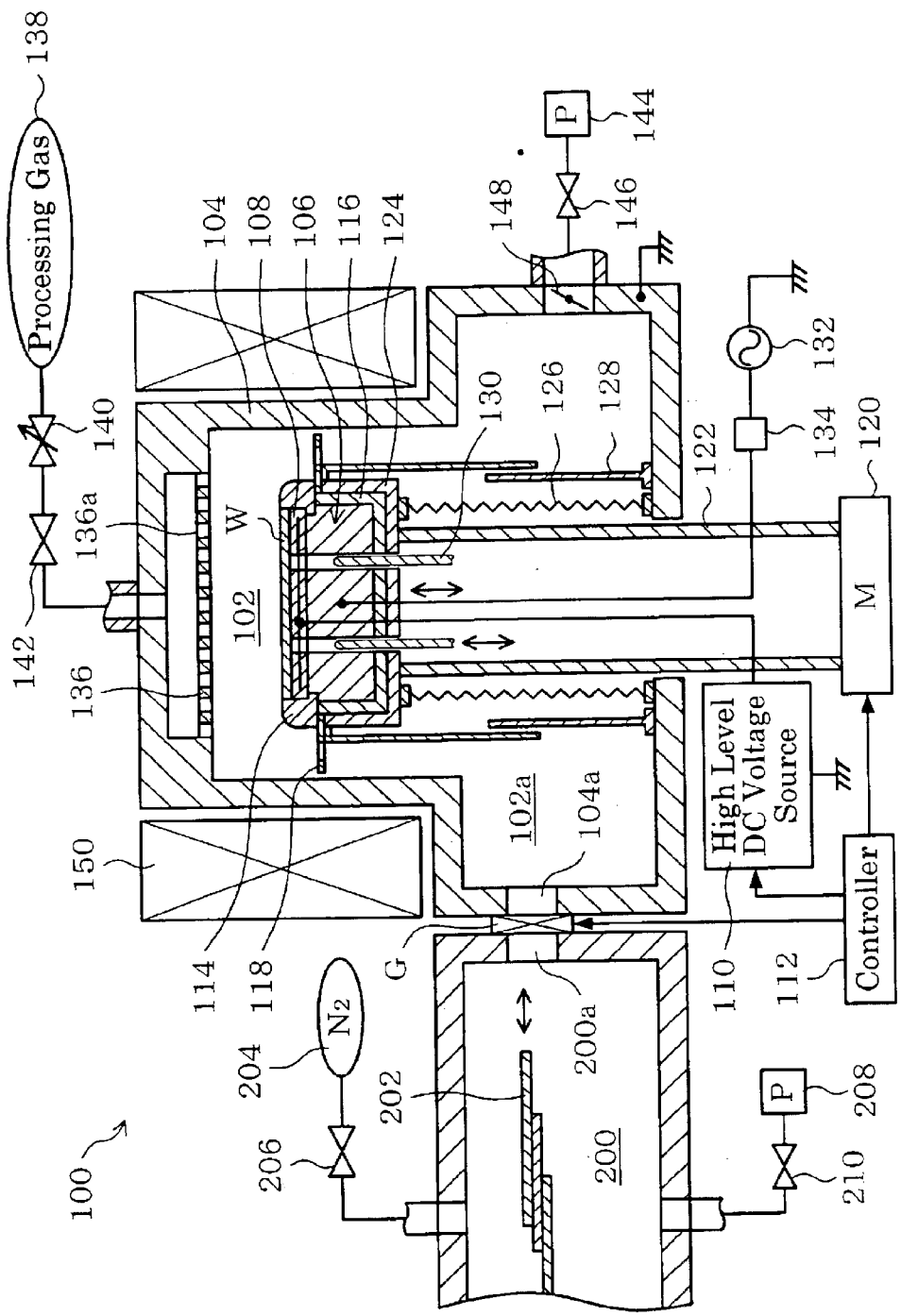
FIG. 1 is a schematic sectional view of an etching apparatus which may adopt the present invention.

First, in reference to FIG. 1, an etching apparatus 100 that may adopt the present invention is summarized. A processing chamber (plasma processing chamber) 102 is formed inside an airtight conductive processing container 104. A conductive lower electrode 106 is provided inside the processing chamber 102. The lower electrode 106 also functions as a stage on which a wafer W is placed. An electrostatic chuck 108 is provided at the mounting surface of the lower electrode 106. The electrostatic chuck 108 is constituted by enclosing a conductive thin film with an insulating thin film. In addition, a high level DC source 110 for outputting a high level DC voltage is connected to the electrostatic chuck 108. The high level DC source 110 is also connected with a controller 112. The controller 112 engages in control of the high level DC source 110 and also control of a drive motor M 120 and a gate valve G to be detailed later. It is to be noted that the details of the control implemented by the controller 112 are to be explained below. In addition, an insulating ring body 114 surrounding the wafer W mounted on the electrostatic chuck 108 is provided at the lower electrode 106. A baffle plate 118 is provided around the lower electrode 106 via an insulating member 116.

The drive motor M 120 is connected to the lower electrode 106 via an elevator shaft 122, a conductive member 124 and the insulating member 116. In such a structure, the lower electrode 106 is made to move up and down by engaging the drive motor M 120 in an operation. In addition, the controller 112 is connected to the drive motor M 120. A bellows 126 constituted of a conductive, airtight and expandable material and a conductive the bellows cover 128 are provided around the elevator shaft 122. The bellows 126 and the bellows cover 128 are each connected with the conductive member 124 and the bottom of the processing container 104 at the two ends.

In addition, a lifter pin 130 is provided at the lower electrode 106. The lifter pin 130 is caused to pass through the lower electrode 106 to project out above the mounting surface at the electrostatic chuck 108 through the operation of a drive motor (not shown) or it can be housed under the mounting surface of the electrostatic chuck 108. Furthermore, a high-frequency source 132 which outputs high-frequency power is connected to the lower electrode 106 via a matcher 134.

An upper electrode 136 facing opposite the mounting surface of the lower electrode 106 is also provided inside the processing chamber 102. The upper electrode 136, which constitutes one of the internal walls of the processing chamber 102, is grounded via the processing container 104. Numerous gas outlet holes 136a are formed at the upper electrode 136. Thus, the processing gas inside a processing gas supply source 138 is supplied into the processing chamber 102 via a flow regulating valve 140, an open/close valve 142 and the gas outlet holes 136a. The gas inside the processing chamber 102 is discharged by a vacuum pump P144 via an open/close valve 146 and a discharge quantity regulating valve 148. Furthermore, a magnet 150 is provided on the outside of a sidewall of the processing chamber 102. The magnet 150 is capable of forming a rotating magnetic field between the upper electrode 136 and the lower electrode 106.

A delivery space 102a in the lower portion of the processing chamber 102 is connected with a delivery chamber 200 via an intake/outlet 104a, the gate valve (means for opening/closing) G and an intake/outlet 200a. When the gate valve G is opened in this structure, the space inside the processing container 104 and the space inside the delivery chamber 200 come into communication with each other. In addition, when the gate valve G is closed, the space inside the processing container 104 becomes pneumatically isolated from the space inside the delivery chamber 200. The controller 112 is connected to the gate valve G. A carrier arm 202 is provided inside the delivery chamber 200. Driven by a drive mechanism (not shown), the carrier arm 202 travels between the delivery chamber 200 and the processing container 104 while holding the wafer W. In addition, an inert gas inside an inert gas supply source 204 is introduced into the delivery chamber 200 via an open/close valve 206. The gas inside the delivery chamber 200 is discharged by a vacuum pump 208 via an open/close valve 210.

(2) Structure for Wafer Transport

Figure 2:
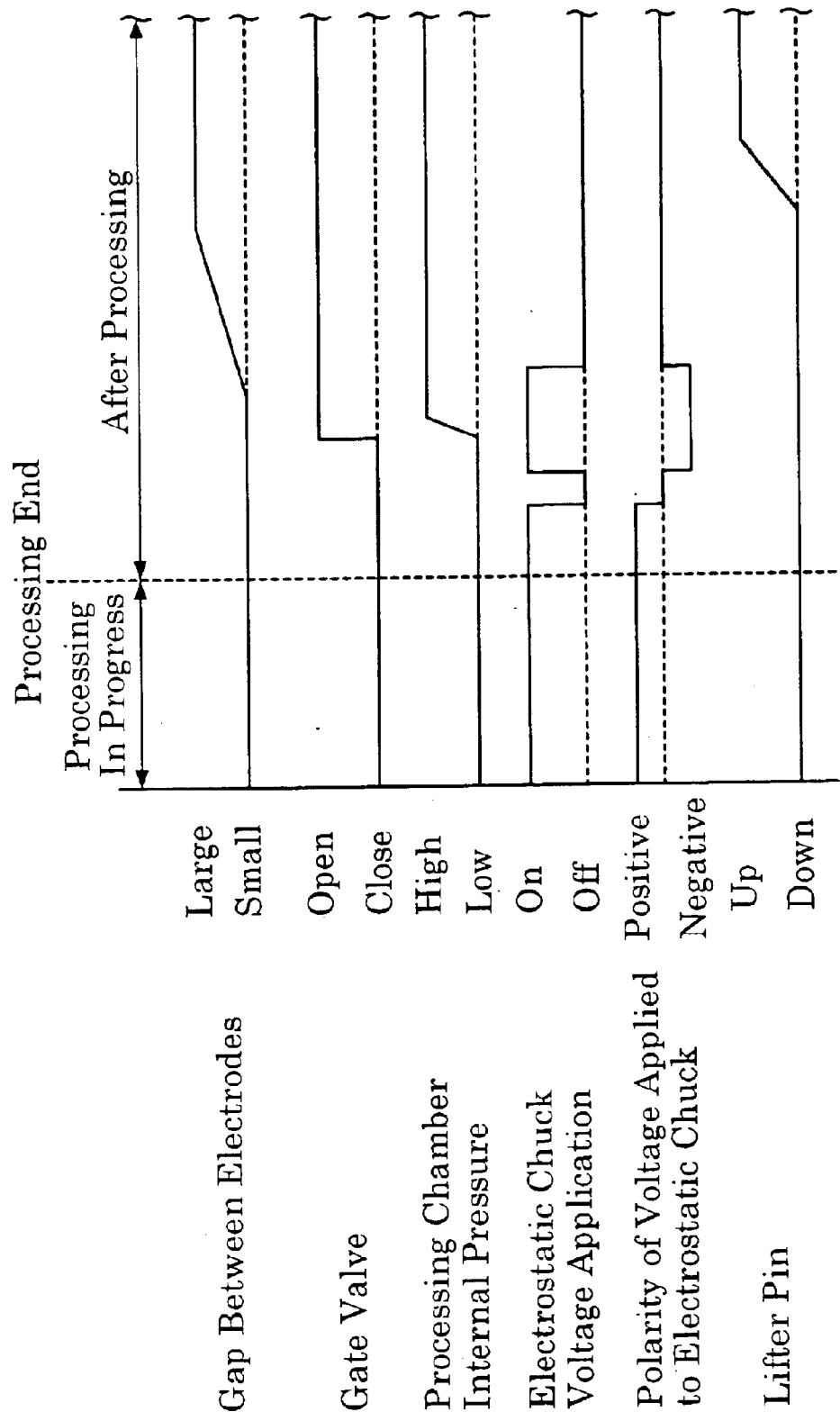
FIG. 2 presents a schematic timing chart of the wafer transport step implemented in the etching apparatus in FIG. 1.

Next, in reference to FIGS. 1 and 2, the structure through which the wafer W is transported, that constitutes the core of the present invention, is explained by using an etching process as an example.

(a) From Delivery of Wafer W to Etching Process

First, the wafer W on the carrier arm 202 is delivered from the delivery chamber 200 into the delivery space 102a and is placed on the lifter pin 130. At this time, the lower electrode 106 is set at the delivery position inside the delivery space 102a at which the relative distance to the upper electrode 136 is longer than the distance to the upper electrode 136 at the plasma processing position which is to be detailed later. In addition, the inert gas, e.g., $N_2$, from the inert gas supply source 204 is constantly introduced into the delivery chamber 200 at a high flow rate of 2000 sccm. At the same time, the gas inside the delivery chamber 200 is discharged at a high discharge rate by the vacuum pump P208. Thus, the pressure inside the delivery chamber 200 is sustained at a level equal to or higher than 100 mTorr, for instance and, more desirably, within the range of 170 mTorr~200 mTorr at all times, regardless of whether or not the gate valve G is open.

The carrier arm 202 moves away into the delivery chamber 200 when the transfer of the wafer W is completed. Then, the gate valve G is closed through the control implemented by the controller 112. In addition, the lifter pin 130 is lowered to place the wafer W on the lifter pin 130 at the mounting surface (chuck surface) of the electrostatic chuck 108. Next, the controller 112 implements control on the high level DC source 110 to apply a high level DC voltage with a positive polarity, e.g., 1.5 kV~2.0 kV, to the electrostatic chuck 108. With this power applied to the electrostatic chuck 108, the wafer W is vacuum held onto the mounting surface of the electrostatic chuck 108. Subsequently, a controller 112 implements control on the drive motor M 120 to raise the lower electrode 106 to the plasma processing position near the upper electrode 136, at which the relative distance to the upper electrode 136 is shorter than the distance to the upper electrode 136 at the delivery position. In addition, the processing gas, e.g., a mixed gas containing $C_4F_8$, $O_2$ and Ar, is introduced into the processing chamber 102 and, at the same time, vacuum drawing is implemented inside the processing chamber 102. As a result, the pressure inside the processing chamber 102 is sustained at a level lower than the pressure inside the delivery chamber 200, e.g., within the range of 1 mTorr~10 mTorr. Then, high-frequency power with its frequency set at, for instance, 13.56 MHz is applied to the lower electrode 106 to raise the processing gas to plasma and a specific etching process is implemented on the wafer W.

(b) From Etching Process end to Wafer W Removal

When the etching process ends, the controller 112 implements control on the high level DC source 110 to apply a high level DC voltage with a negative polarity, which is the reverse of the positive polarity mentioned above, to the electrostatic chuck 108. The high level DC voltage with the negative polarity is set at, for instance, −300 V. Then, the controller 112 opens the gate valve G while allowing the lower electrode 106 to remain at the plasma processing position. As a result, $N_2$ inside the delivery chamber 200 flows instantaneously into the processing chamber 102 to set the pressure inside the processing chamber 102 equal to the pressure inside the delivery chamber 200. Consequently, the residual charge at the wafer W accumulated following the end of the etching process becomes dissipated through self discharge, which occurs so gently as to avoid damage to the wafer W. In addition, since the high level DC voltage with the negative polarity applied to the wafer W further promotes the elimination of the residual charge, even when the lower electrode 106 is lowered to the delivery position and the distance between the wafer W and the upper electrode 136 increases, as explained later, the voltage between the wafer W and the upper electrode 136 does not rise. Consequently, even when the wafer W is disengaged from the mounting surface of the electrostatic chuck 108 by raising the lifter pin 130, no abnormal discharge, occurs between the wafer W and the conductive lifter pin 130, to prevent damage to the wafer W. Moreover, occurrence of an abnormal discharge between the wafer W and the hole housing the lifter pin 130 is prevented, as well.

Next, the controller 112 implements control on the drive motor M 120 to lower the lower electrode 106 from the plasma processing position to the delivery position. In addition, the controller 112 stops the output of the negative polarity high level DC voltage from the high level DC source 110. After the lower electrode 106 completes its descent to the delivery position, the lifter pin 130 is raised to place the wafer W over the mounting surface of the electrostatic chuck 108. Next, the carrier arm 202 inside the delivery chamber 200 is caused to advance into the delivery space 102a to receive the wafer W on the lifter pin 130. Then, the carrier arm 202 holding the wafer W is pulled back into the delivery chamber 200.

Second Embodiment

Next, the second embodiment of the present invention is explained. It is to be noted that since this embodiment, too, is adopted in the plasma etching apparatus 100 described earlier, an explanation on the structure of the apparatus is omitted. In addition, since the individual steps performed up to the end of the etching process are identical to those implemented in the first embodiment, their explanation is omitted.

Figure 3:
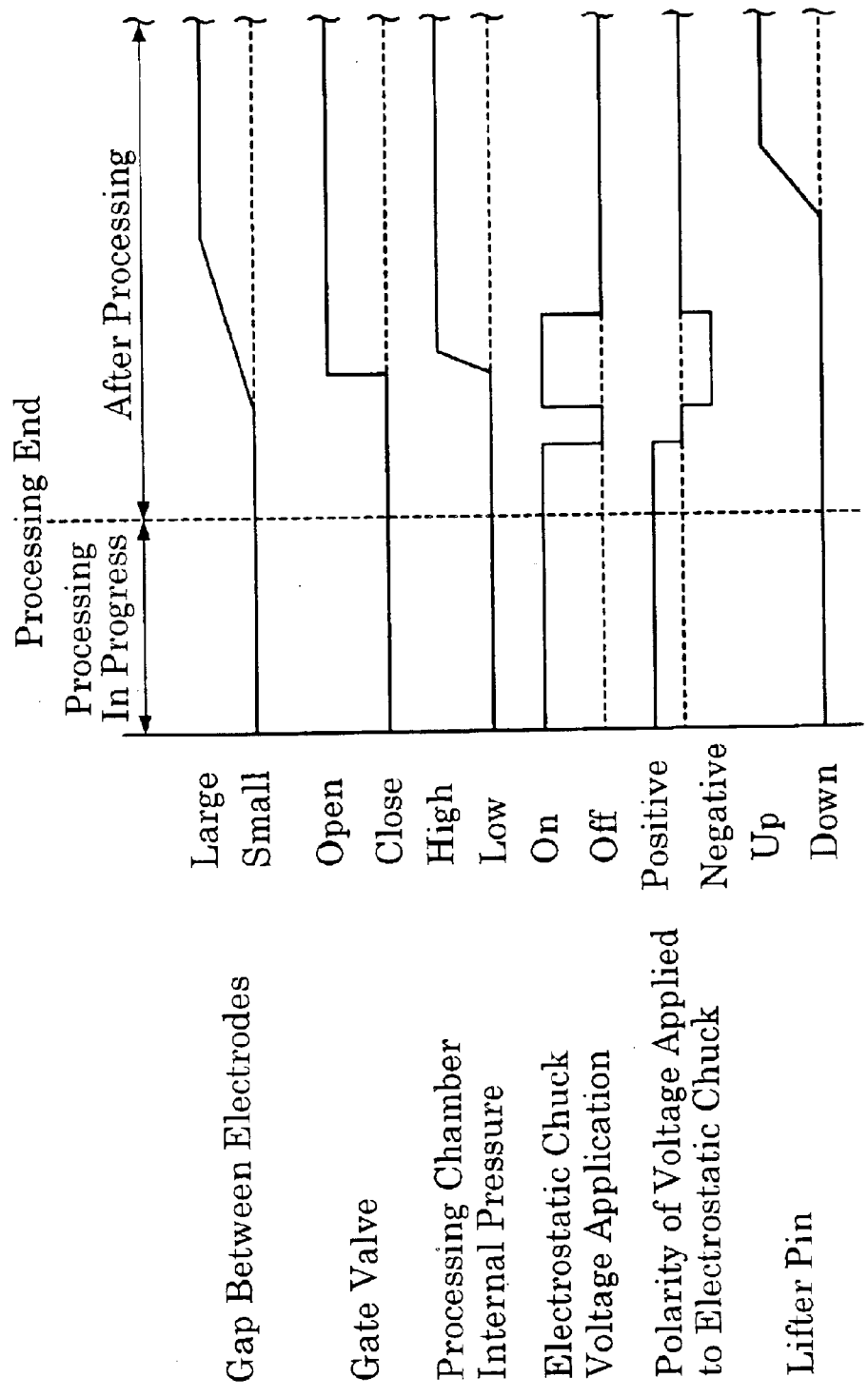
FIG. 3 presents a schematic timing chart of another wafer transport step which may be implemented in the etching apparatus in FIG. 1.

The embodiment is characterized in that $N_2$ gas is introduced into the processing chamber 102 immediately after the lower electrode 106 is lowered from the plasma processing position. Namely, when the etching process ends, the polarity of the high level DC voltage applied to the electrostatic chuck 108 is switched from positive to negative as illustrated in FIG. 3, while allowing the lower electrode 106 to remain at the plasma processing position. Then, the lower electrode 106 is lowered from the plasma processing position. Immediately after the lower electrode 106 starts to descend, the gate valve G is opened to allow $N_2$ in the delivery chamber 200 to flow into the processing chamber 102. As a result, the pressure inside the processing chamber 102 is set at a level equal to the pressure in the delivery chamber 200, to cause the residual charge at the wafer W to dissipate. Then, the application of the high-level DC voltage to the electrostatic chuck 108 is stopped. When the lower electrode 106 completes its descent to the delivery position, the lifter pin 130 is raised to disengage the wafer W from the electrostatic chuck 108. Subsequently, the wafer W is transported into the delivery chamber 200 on the carrier arm 202.

In the second embodiment assuming the structure described above, $N_2$ inside the delivery chamber 200 is introduced into the processing chamber 102 while the lower electrode 106 is descending toward the delivery position, and thus, the descent of the processing chamber 102 can be started with a timing similar to the timing adopted in the prior art. As a result, any reduction in the throughput which may otherwise occur due to the $N_2$ introduction is prevented.

Third Embodiment
(1) Structure of the Etching Apparatus

While an explanation is given in reference to the first and second embodiments on an example in which the present invention is adopted in a plasma processing apparatus having a wafer (lower electrode) elevating mechanism, the present invention may be adopted in a plasma processing apparatus without a wafer (lower electrode) elevating mechanism.

Figure 4:
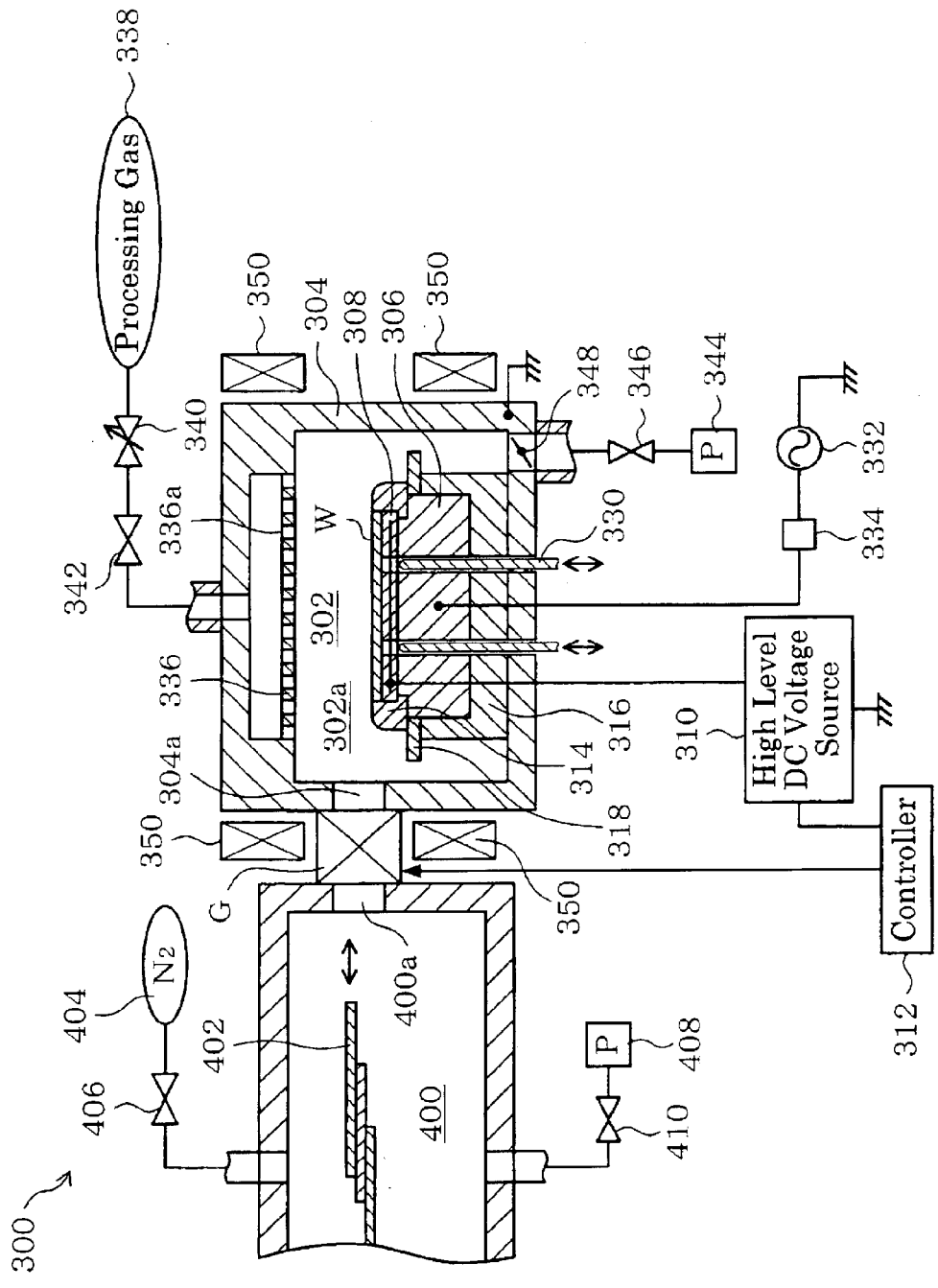
FIG. 4 is a schematic sectional view of another etching apparatus that may adopt the present invention.

First, an etching apparatus 300 which may adopt the present invention is summarized in reference to FIG. 4. A processing chamber (plasma processing chamber) 302 is formed inside an airtight conductive processing container 304. A conductive lower electrode 306 is provided inside the processing chamber 302. The lower electrode 306 also functions as a stage on which a wafer W is placed. An electrostatic chuck 308 is provided at the mounting surface of the lower electrode 306. The electrostatic chuck 308 is constituted by enclosing a conductive thin film with an insulating thin film. In addition, a high level DC source 310 for outputting a high level DC voltage is connected to the electrostatic chuck 308. The high level DC source 310 is also connected with a controller 312. The controller 312 engages in control of the high level DC source 310 and control of a gate valve G. It is to be noted that the details of the control implemented by the controller 312 are to be explained below. In addition, an insulating ring body 314 surrounding the wafer W mounted on the electrostatic chuck 308 is provided at the lower electrode 306. A baffle plate 318 is provided around the periphery of the lower electrode 306 via an insulating member 316.

In addition, a lifter pin 330 is provided at the lower electrode 306. The lifter pin 330 is caused to pass through the electrostatic chuck 308 to project out above the mounting surface at the lower electrode 306 through the operation of a drive motor (not shown) or it can be housed under the mounting surface of the electrostatic chuck 308. Furthermore, a high-frequency source 332 which outputs high-frequency power is connected to the lower electrode 306 via a matcher 334.

An upper electrode 336 facing opposite the mounting surface of the lower electrode 306 is also provided inside the processing chamber 302. The upper electrode 336, which constitutes one of the internal walls of the processing chamber 302, is grounded via the processing container 304. Numerous gas outlet holes 336a are formed at the upper electrode 336. Thus, the processing gas inside a processing gas supply source 338 is supplied into the processing chamber 302 via a flow regulating valve 340, an open/close valve 342 and the gas outlet holes 336a. The gas inside the processing chamber 302 is discharged by a vacuum pump P344 through the bottom of the processing chamber 302 via an open/close valve 346 and a discharge quantity regulating valve 348. Furthermore, a magnet 350 constituted of upper and lower split portions is provided on the outside of a sidewall of the processing chamber 302. The magnet 350 is capable of forming a rotating magnetic field between the upper electrode 336 and the lower electrode 306.

A delivery space 302a in a side portion of the processing chamber 302 is connected with a delivery chamber 400 via an intake/outlet 304a, the gate valve (means for opening/closing) G located between the upper and lower portions of the magnet 350 and an intake/outlet 304a. When the gate valve G is opened in this structure, the space inside the processing container 304 and the space inside the delivery chamber 400 come into communication with each other. In addition, when the gate valve G is closed, the space inside the processing container 304 becomes airtightly isolated from the space inside the delivery chamber 400. The controller 312 is connected to the gate valve G. A carrier arm 402 is provided inside the delivery chamber 400. Driven by a drive mechanism (not shown), the carrier arm 402 travels between the delivery chamber 400 and the processing container 304 while holding the wafer W. In addition, an inert gas inside an inert gas supply source 404 is introduced into the delivery chamber 400 via an open/close valve 406. The gas inside the delivery chamber 400 is discharged by a vacuum pump 408 via an open/ close valve 410.

(2) Structure for Transporting Wafer

Figure 5:
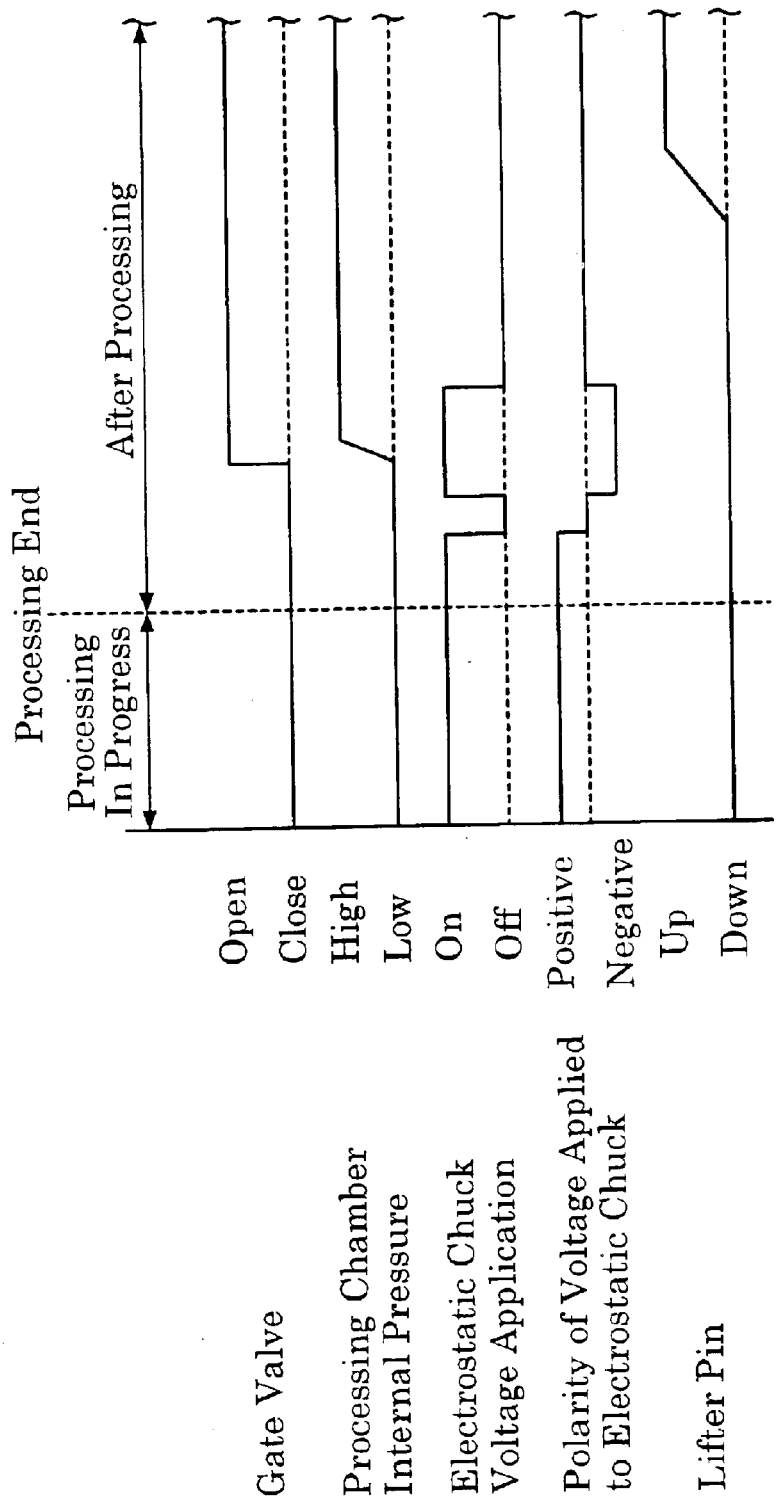
FIG. 5 presents a schematic timing chart of the wafer transport step implemented in the etching apparatus in FIG. 4.

Next, in reference to FIGS. 4 and 5, the structure through which the wafer W is transported, that constitutes the core of the present invention, is explained by using an etching process as an example.

(a) From Delivery of Wafer W to Etching Process

First, the wafer W on the carrier arm 402 is delivered from the delivery chamber 400 into the delivery space 302a and is placed on the lifter pin 330. In addition, the inert gas, e.g., $N_2$, from the inert gas supply source 404 is constantly introduced into the delivery chamber 400 at a high flow rate of 2000 sccm. At the same time, the gas inside the delivery chamber 400 is discharged at a high discharge rate by the vacuum pump P408. Thus, the pressure inside the delivery chamber 400 is sustained at a level within the range of 10 mTorr~1 Torr and, more desirably, within the range of 100 mTorr~500 mTorr at all times, regardless of whether or not the gate valve G is open, since no discharge occurs if the pressure is too high or too low and it will take a long time for the wafer W to reach the delivery space 302a if the pressure is too high.

The carrier arm 402 moves away into the delivery chamber 400 when the transfer of the wafer W is completed. Then, the gate valve G is closed through the control implemented by the controller 312. In addition, the lifter pin 330 is lowered to place the wafer W on the lifter pin 330 at the mounting surface (chuck surface) of the electrostatic chuck 308. Next, the controller 312 implements control on the high level DC source 310 to apply a high level DC voltage with a positive polarity, e.g., 1.5 kV~2.0 kV, to the electrostatic chuck 308. With this power applied to the electrostatic chuck 308, the wafer W is vacuum held onto the mounting surface of the electrostatic chuck 308.

In addition, the processing gas, e.g., a mixed gas containing $C_4F_8$, $O_2$ and Ar, is introduced into the processing chamber 302 and, at the same time, vacuum drawing is implemented inside the processing chamber 302. As a result, the pressure inside the processing chamber 302 is sustained at a level lower than the pressure inside the delivery chamber 400, e.g., within the range of 1 mTorr~10 mTorr. Then, high-frequency power with its frequency set at, for instance, 13.56 MHz is applied to the lower electrode 306 to raise the processing gas to plasma and a specific etching process is implemented on the wafer W.

(b) From Etching Process end to Wafer W Removal

When the etching process ends, the controller 312 implements control on the high level DC source 310 to apply a high level DC voltage with a negative polarity, which is the reverse of the positive polarity mentioned above, to the electrostatic chuck 308. The high level DC voltage with the negative polarity is set at, for instance, 300 V. Then, the controller 312 opens the gate valve G. As a result, $N_2$ inside the delivery chamber 400 flows instantaneously into the processing chamber 302 to set the pressure inside the processing chamber 302 equal to the pressure inside the delivery chamber 400. Consequently, the residual charge at the wafer W accumulated following the end of the etching process becomes dissipated through a self discharge, which occurs so gently as to avoid damage to the wafer W. In addition, the high level DC voltage with the negative polarity applied to the wafer W further promotes the elimination of the residual charge. Thus, the voltage between the wafer W and the upper electrodes 336 does not rise, and even when the wafer W is disengaged from the mounting surface of the electrostatic chuck 308 by raising the lifter pin 330, no abnormal discharge occurs between the wafer W and the conductive lifter pin 330, to prevent damage to the wafer W. Moreover, occurrence of an abnormal discharge between the wafer W and the hole housing the lifter pin 330 is prevented, as well.

Next, the controller 312 stops in the output of the negative polarity high level DC voltage from the high level DC source 310. The controller 312 then raises the lifter pin 330 to place the wafer W over the mounting surface of the electrostatic chuck 308. Next, the carrier arm 402 inside the delivery chamber 400 is caused to advance into the delivery space 302a to receive the wafer W on the lifter pin 330. Then, the carrier arm 402 holding the wafer W is pulled back into the delivery chamber 400.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiments on an example in which a high level DC voltage with reverse polarity is applied to the electrostatic chuck during a period of time starting before the gate valve is opened and ending after the gate valve is opened, the present invention is not restricted by these particulars, and the high-level DC voltage with a reverse polarity may be applied to the electrostatic chuck until immediately after the gate valve is opened with arbitrary timing.

In addition, while an explanation is given in reference to the first and second embodiments on an example in which the lifter pin is raised after the lower electrode completes its descent to the delivery position, the present invention is not restricted by these particulars, and the lifter pin may be raised while the lower electrode is still in the process of descent, instead.

While an explanation is given in reference to the embodiments on an example in which the present invention is adopted in a plasma etching apparatus, the present invention is not restricted by these particulars, and it may be adopted in any of various other plasma processing apparatuses including a plasma CVD apparatus and a plasma ashing apparatus. Furthermore, the present invention may be adopted on a workpiece constituted of an LCD glass substrate instead of the wafer described earlier.

According to the present invention, the residual charge at the workpiece can be eliminated by introducing the gas inside the delivery chamber into the plasma processing chamber. As a result, any damage to the workpiece which would otherwise be caused by an abnormal discharge occurring during removal of the workpiece can be prevented without having to make a design modification or lowering the throughput.

The entire disclosure of Japanese Patent Application No. 11-268578 filed on Sep. 22, 1999 including specification, claims, drawings and summary is incorporated herein by reference in its entirety.

What is claimed is:

1. A plasma processing method, comprising:
   a step in which a workpiece is placed at a mounting surface of an electrode provided inside a plasma processing chamber;

a step in which said workpiece is electrostatically held by applying a high level DC voltage to an electrostatic chuck provided at said mounting surface of said electrode;

a step in which plasma processing is performed on said workpiece under a reduced pressure atmosphere;

a step in which said electrode is moved from an upper plasma processing position to a lower delivery position after said plasma processing ends;

a step of opening a means for opening/closing which switchably connects a delivery chamber to said plasma processing chamber for transfer of said workpiece from/to said plasma processing chamber during the moving operation of said electrode; and a step of introducing gas into said plasma processing chamber via said delivery chamber.

2. A plasma processing method according to claim 1, wherein the pressure inside said delivery chamber and the pressure inside said plasma processing chamber are set roughly equal to each other before said electrode reaches the lower delivery position.

3. A plasma processing method according to claim 1, wherein after the electrode completes its descent operation, the workpiece is lifted from the mounting surface of the electrode by a lifter pin.

4. A plasma processing method according to claim 3, wherein at least a portion of the lifter pin which contacts the workpiece is electrically conductive.

5. A plasma processing method according to claim 4, wherein said workpiece is a semiconductor wafer.

6. A plasma processing method, comprising:

a step in which a workpiece is placed at a mounting surface of an electrode provided inside a plasma processing chamber;

a step in which said workpiece is electrostatically held by applying a high level DC voltage to an electrostatic chuck provided at said mounting surface of said electrode;

a step in which plasma processing is performed on said workpiece under a reduced pressure atmosphere;

a step of opening a means for opening/closing which switchably connects a delivery chamber to said plasma processing chamber for transfer of said workpiece from/to said plasma processing chamber after the step of plasma processing;

a step in which said electrode is moved from an upper plasma processing position to a lower delivery position after the means for opening/closing is opened, and a step of introducing gas into said plasma processing chamber via said delivery chamber.

7. A plasma processing method according to claim 6, wherein the pressure inside said delivery chamber and the pressure inside said plasma processing chamber are set roughly equal to each other before said electrode is moved.

8. A plasma processing method according to claim 6, wherein after the electrode completes its descent operation, the workpiece is lifted from the mounting surface of the electrode by a lifter pin.

9. A plasma processing method according to claim 8, wherein at least a portion of the lifter pin which contacts the workpiece is electrically conductive.

10. A plasma processing method according to claim 9, wherein said workpiece is a semiconductor wafer.

11. A plasma processing method according to claim 1, wherein the delivery chamber is maintained at a non-vacuum pressure during said step of opening the means for opening/closing.

12. A plasma processing method according to claim 6, wherein the delivery chamber is maintained at a non-vacuum pressure during said step of opening the means for opening/closing.

13. A plasma processing method according to claim 1, wherein said step of introducing gas into said plasma processing chamber via said delivery chamber occurs during a first time period, wherein said step in which said electrode is moved from said upper plasma processing position to said lower delivery position occurs during a second time period, and wherein said first time period and said second time period at least partially overlap.

14. A plasma processing method according to claim 6, wherein said step of introducing gas into said plasma processing chamber via said delivery chamber occurs during a first time period, where said step in which said electrode is moved from said upper plasma processing position to said lower delivery position occurs during a second time period, and wherein said first time period and said second time period at least partially overlap.

* * * * *